(12) United States Patent
Jeong et al.

(10) Patent No.: US 10,517,171 B2
(45) Date of Patent: Dec. 24, 2019

(54) METHOD FOR FABRICATING FLEXIBLE SUBSTRATE

(71) Applicant: LG CHEM, LTD., Seoul (KR)

(72) Inventors: Hye Won Jeong, Daejeon (KR); Yong Goo Son, Daejeon (KR); Kyungjun Kim, Daejeon (KR); Bo Ra Shin, Daejeon (KR); Chang Yoon Lim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 172 days.

(21) Appl. No.: 15/527,261

(22) PCT Filed: Jul. 25, 2016

(86) PCT No.: PCT/KR2016/008074
§ 371 (c)(1),
(2) Date: May 16, 2017

(87) PCT Pub. No.: WO2017/018753
PCT Pub. Date: Feb. 2, 2017

(65) Prior Publication Data
US 2017/0374737 A1 Dec. 28, 2017

(30) Foreign Application Priority Data

Jul. 24, 2015 (KR) .................. 10-2015-0104964
Jul. 20, 2016 (KR) .................. 10-2016-0093295

(51) Int. Cl.
*H05K 1/03* (2006.01)
*B32B 15/08* (2006.01)
(Continued)

(52) U.S. Cl.
CPC .......... *H05K 1/0393* (2013.01); *B32B 15/08* (2013.01); *F21K 99/00* (2013.01); *H01B 3/30* (2013.01);
(Continued)

(58) Field of Classification Search
CPC ...................................... H01K 3/101
See application file for complete search history.

(56) References Cited

U.S. PATENT DOCUMENTS 5,360,647 A    11/1994  Sumida
8,426,548 B2   4/2013   Kikuchi et al.
(Continued)

FOREIGN PATENT DOCUMENTS

EP    2985143 A1    2/2016
EP    2985144 A1    2/2016
(Continued)

OTHER PUBLICATIONS

Translation of document N.*
(Continued)

*Primary Examiner* — Austin Murata
(74) *Attorney, Agent, or Firm* — Rothwell, Figg, Ernst & Manbeck, P.C.

(57) ABSTRACT

The present invention relates to a method for producing a flexible substrate. According to the method of the present invention, a flexible substrate layer can be easily separated from a carrier substrate even without the need for laser or light irradiation so that a device can be prevented from deterioration of reliability and occurrence of defects caused by laser or light irradiation. In addition, according to the method of the present invention, a flexible substrate can be continuously produced in an easier manner based on a roll-to-roll process.

12 Claims, 2 Drawing Sheets

(51) Int. Cl.
    H05K 1/02      (2006.01)
    H05K 3/00      (2006.01)
    H05K 3/20      (2006.01)
    F21K 99/00     (2016.01)
    H01B 3/30      (2006.01)
    H01B 5/14      (2006.01)
    H01B 7/04      (2006.01)
    H01B 13/00     (2006.01)
    H01L 31/0236   (2006.01)
    H01L 51/00     (2006.01)
    H01L 51/44     (2006.01)
    H01L 51/52     (2006.01)

(52) U.S. Cl.
    CPC ............... *H01B 5/14* (2013.01); *H01B 7/04* (2013.01); *H01B 13/00* (2013.01); *H01L 31/0236* (2013.01); *H01L 51/0023* (2013.01); *H01L 51/0097* (2013.01); *H05K 1/0283* (2013.01); *H05K 1/0313* (2013.01); *H05K 1/0346* (2013.01); *H05K 3/0041* (2013.01); *H05K 3/20* (2013.01); *H05K 3/207* (2013.01); *H01L 51/445* (2013.01); *H01L 51/5212* (2013.01); *H01L 51/5228* (2013.01); *H05K 2201/0108* (2013.01); *H05K 2201/0154* (2013.01); *H05K 2201/0317* (2013.01); *H05K 2201/10106* (2013.01); *H05K 2201/10128* (2013.01); *H05K 2203/0156* (2013.01); *H05K 2203/0264* (2013.01); *H05K 2203/1545* (2013.01); *Y02E 10/549* (2013.01); *Y02P 20/582* (2015.11)

(56) References Cited

U.S. PATENT DOCUMENTS

| | | | |
|---|---|---|---|
| 9,510,457 | B2 | 11/2016 | Kang et al. |
| 9,611,358 | B2 | 4/2017 | Jeong et al. |
| 10,035,883 | B2 | 7/2018 | Jeong et al. |
| 2004/0063900 | A1* | 4/2004 | Kaneshiro ............... B29C 41/28 528/353 |
| 2005/0061423 | A1 | 3/2005 | Kohayashi |
| 2008/0138537 | A1 | 6/2008 | Simone et al. |
| 2009/0197110 | A1 | 8/2009 | Kikuchi et al. |
| 2014/0034364 | A1* | 2/2014 | Kang ....................... H05K 3/20 174/254 |
| 2015/0239210 | A1 | 8/2015 | Jeong et al. |

FOREIGN PATENT DOCUMENTS

| | | | |
|---|---|---|---|
| EP | 2832536 | B1 | 5/2017 |
| JP | 2004-195875 | A | 7/2004 |
| JP | 2005-272485 | A | 10/2005 |
| JP | 2006-199855 | A | 8/2006 |
| JP | 2009-220285 | A | 10/2009 |
| JP | 2010-001468 | A | 1/2010 |
| JP | 2010-201889 | * | 9/2010 |
| JP | 2013-183053 | A | 9/2013 |
| JP | 2014-001392 | A | 1/2014 |
| KR | 10-1161301 | B1 | 7/2012 |
| KR | 10-1291703 | B1 | 7/2013 |
| KR | 10-2014-0028243 | A | 3/2014 |
| KR | 10-2014-0122205 | A | 10/2014 |
| KR | 10-2015-0047002 | A | 5/2015 |
| WO | 2006/033267 | A1 | 3/2006 |
| WO | 2009/142248 | A1 | 11/2009 |
| WO | 2012/043304 | A1 | 4/2012 |
| WO | 2014/168400 | A1 | 10/2014 |

OTHER PUBLICATIONS

Search Report issued for International Application No. PCT/KR2016/008074 dated Nov. 2, 2016 (3 pages).

Office Action issued for Japanese Patent Application No. 2017-530032 dated Jul. 3, 2018, 3 pages.

Office Action issued for Chinese Patent Application No. 201680003320.X dated Jul. 3, 2018, 11 pages.

Search Report issued for European Patent Application No. 16830786.6 dated Jan. 22, 2019, 10 pages.

* cited by examiner

[Fig. 1]
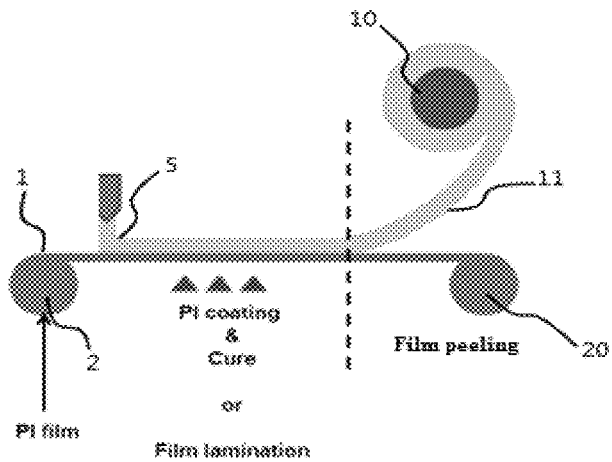
[Fig. 2]
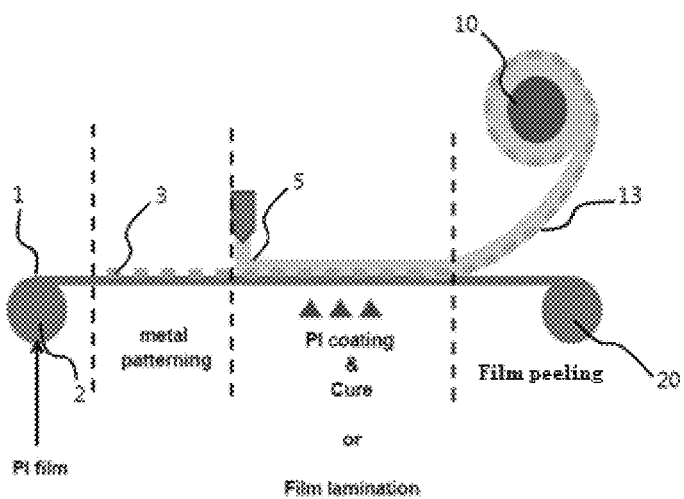

[Fig. 3]
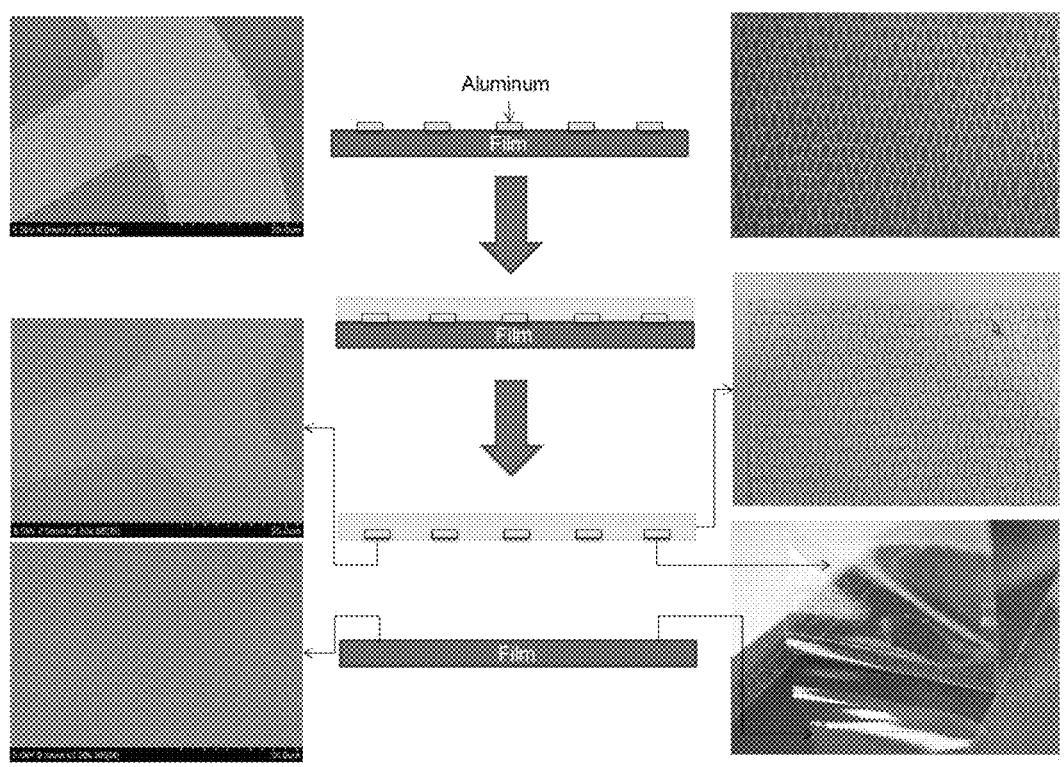

METHOD FOR FABRICATING FLEXIBLE SUBSTRATE

CROSS-REFERENCE TO RELATED APPLICATIONS

This application is a 35 U.S.C. § 371 National Phase Entry Application from PCT/KR2016/008074, filed on Jul. 25, 2016, and designating the United States, which claims priority under 35 U.S.C. § 119 to Korean Patent Application No. 10-2015-0104964, filed on Jul. 24, 2015, and Korean Patent Application No. 10-2016-0093295, filed on Jul. 22, 2016, the entire disclosures of which are incorporated herein by reference.

BACKGROUND OF THE INVENTION

1. Field of the Invention

The present invention relates to a method for producing a flexible substrate, and more specifically to a method for more efficiently producing a flexible substrate using a carrier substrate from which the flexible substrate is easy to peel.

2. Description of the Related Art

Flexible electronics, for example, flexible displays, solar cells, area lighting devices, e-papers, flexible secondary batteries, and touch panels, have recently received attention as promising technologies.

Flexible electronics have developed to make inexpensive, easy-to-bend, and transparent electronic devices and systems.

According to a conventional process for producing a flexible substrate, a solvent-containing solution for producing a flexible substrate is applied to a metal belt or drum to form a prefilm, and the prefilm is separated, dried, and cured. This process is complicated and has low productivity.

Techniques for producing soft substrates including transparent electrodes with low resistance are essentially needed to realize flexible electronics.

Several approaches are known to reduce the resistance of metal wires, for example, (1) by reducing the resistivity (p) of the wires, (2) by decreasing the length of the wires, or (3) by increasing the height (thickness) of the wires. For approach (1), however, resistivity limits the choice of materials. Copper is presently the most widely used material due to its sufficiently low resistivity. Other materials, such as silver, are only available at high prices, limiting their use. Approach (2) is physically limited due to problems associated with circuit design. In view of the limitations of approaches (1) and (2), approach (3) is considered acceptable. However, as the height of wires increases, many problems may arise, for example, disordered alignment of the wires, electrical shorting, short circuiting between the wires, and damage to the wires.

Thus, there is a need to insert metal wires into a substrate. In this connection, conventional techniques include etching techniques for forming a desired pattern of metal wires by deposition and etching and damascene techniques for damascening wires into grooves formed in an insulating film by applying CMP to a film, such as a copper (Cu) thin film, which is difficult to dry etch for patterning.

However, such conventional techniques require the consumption of large amounts of materials by repeated deposition/etching, involve complicated processing steps, and cause thermal damage to a plastic substrate upon thermal treatment of a metal layer formed in the plastic substrate.

To solve the above problems, a proposal has been made on a technique wherein metal wires are formed on a hard substrate, a curable polymer is coated and cured thereon, and the hard substrate is mechanically peeled. However, according to this technique, when the hard substrate is forcibly peeled from the metal wire embedded polymer substrate, damage to the metal wires and the polymer substrate is caused, leading to defects in a final product. Portions of the hard substrate remain unremoved from the polymer substrate and act as impurities.

Under such circumstances, a method has been proposed in which a water or organic solvent soluble or photodegradable sacrificial layer is formed on a carrier substrate, a metal wire embedded soft substrate layer is formed on the sacrificial layer, and the sacrificial layer is removed to separate and recover the flexible soft substrate from the carrier substrate. According to this method, however, removal of the sacrificial layer by dissolution in water or an organic solvent or photodecomposition increases the costs associated with the treatment of the water or organic solvent after use.

SUMMARY OF THE INVENTION

It is one object of the present invention to provide a method for more easily producing a flexible substrate using a carrier substrate from which the flexible substrate is easy to peel.

It is a further object of the present invention to provide a method for more easily producing a flexible substrate with metal patterns without the need for deposition and etching.

It is another object of the present invention to provide a flexible substrate that can be produced and distributed in the form of a roll.

One aspect of the present invention provides a method for producing a flexible substrate, including feeding a carrier substrate including a polyimide resin, forming a flexible substrate layer including a curable polymer on the carrier substrate, separating the flexible substrate layer from the carrier substrate layer by the application of a physical stimulus without causing chemical changes in the carrier substrate and the flexible substrate layer, and winding the flexible substrate layer separated from the carrier substrate layer to collect the flexible substrate layer in the form of a roll wherein the steps are performed by a roll-to-roll process.

According to one embodiment, the method may further include forming metal patterns on the carrier substrate before formation of the flexible substrate layer. In this embodiment, a flexible substrate with the metal patterns can be produced.

According to one embodiment, the method may further include forming a hard coating layer on the carrier substrate before formation of the flexible substrate layer. In this embodiment, a flexible substrate with the hard coating layer can be produced.

According to one embodiment, the method may further include forming a hard coating layer on the flexible substrate layer after formation of the flexible substrate layer. In this embodiment, a flexible substrate with the hard coating layer can be produced.

According to one embodiment, the method may further include forming metal patterns on the hard coating layer. In this embodiment, a flexible substrate with the hard coating layer can be produced.

According to one embodiment, the method may further include forming a hard coating layer on the flexible substrate layer with the metal patterns. In this embodiment, a flexible substrate with the hard coating layer can be produced.

According to one embodiment, the flexible substrate layer may be formed by casting a composition including a diamine and an excess of an acid dianhydride, followed by heating and curing.

According to one embodiment, at least a portion of the flexible substrate layer may be in direct contact with the carrier substrate including a polyimide resin.

The metal patterns may be embedded in the flexible substrate layer.

The method may further include winding the carrier substrate layer separated from the flexible substrate layer to collect the carrier substrate layer in the form of a roll.

The physical stimulus may be a tension applied during winding and collection of the carrier substrate and the flexible substrate layer.

According to one embodiment, the carrier substrate layer may have an adhesion strength of at least 1 N/cm to the flexible substrate layer before application of the physical stimulus.

According to one embodiment, the carrier substrate layer may have a peel strength not greater than 0.3 N/cm from the flexible substrate layer after application of the physical stimulus.

According to one embodiment, when the adhesion strengths of the carrier substrate layer to the flexible substrate layer before and after application of the physical stimulus causing no chemical changes in the carrier substrate and the flexible substrate layer are defined as A1 and A2, respectively, the ratio A2/A1 may be from 0.001 to 0.5.

According to one embodiment, the polyimide resin included in the carrier substrate may be prepared by reacting an aromatic tetracarboxylic dianhydride of Formula 1:

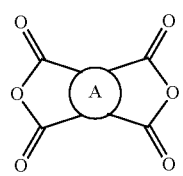

(1)

wherein A is a tetravalent aromatic organic group of Formula 2a or 2b:

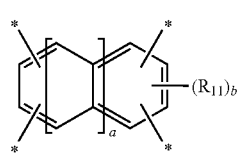

(2a)

wherein $R_{11}$ is a $C_1$-$C_4$ alkyl or $C_1$-$C_4$ haloalkyl group, a is an integer from 0 to 3, and b is an integer from 0 to 2,

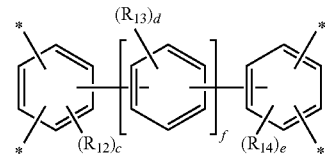

(2b)

wherein $R_{12}$ to $R_{14}$ are each independently a $C_1$-$C_4$ alkyl or $C_1$-$C_4$ haloalkyl group, c and e are each independently an integer from 0 to 3, d is an integer from 0 to 4, and f is an integer from 0 to 3, with an aromatic diamine compound having a linear structure to give a polyamic acid, and curing the polyamic acid at a temperature of 200° C. or above.

According to one embodiment, the polyimide resin included in the carrier substrate may be prepared by reacting an excess of the dianhydride with the diamine compound.

According to one embodiment, the aromatic diamine compound may be represented by Formula 4a or 4b:

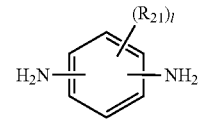

(4a)

wherein $R_{21}$ is a $C_1$-$C_{10}$ alkyl or $C_1$-$C_{10}$ haloalkyl group and l is an integer from 0 to 4,

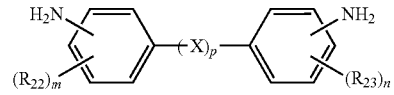

(4b)

wherein $R_{22}$ and $R_{23}$ are each independently a $C_1$-$C_{10}$ alkyl or $C_1$-$C_{10}$ haloalkyl group, X is selected from the group consisting of —O—, —CR$_{24}$R$_{25}$—, —C(=O)—, —C(=O)O—, —C(=O)NH—, —S—, —SO—, —SO$_2$—, —O[CH$_2$CH$_2$O]$_q$—, $C_6$-$C_{18}$ monocyclic and polycyclic cycloalkylene groups, $C_6$-$C_{18}$ monocyclic and polycyclic arylene groups, and combinations thereof, $R_{24}$ and $R_{25}$ are each independently selected from the group consisting of a hydrogen atom, $C_1$-$C_{10}$ alkyl groups, and $C_1$-$C_{10}$ haloalkyl groups, q is an integer of 1 or 2, m and n are each independently an integer from 0 to 4, and p is an integer of 0 or 1.

According to one embodiment, the carrier substrate separated from the flexible substrate layer may be collected for reuse.

A further aspect of the present invention provides an apparatus for producing a flexible substrate, including carrier substrate feeding means for unwinding and feeding a carrier substrate, transfer means for transferring the carrier substrate, polymer coating means for applying a curable polymer to the carrier substrate to form a resin layer for the production of a flexible substrate, curing means for curing the resin layer, flexible substrate collecting means for winding and collecting the flexible substrate layer disposed on the carrier substrate, and carrier substrate collecting means for winding and collecting the carrier substrate separated from flexible substrate layer.

The apparatus may further include patterning means for forming metal patterns on the carrier substrate.

Another aspect of the present invention provides a flexible substrate produced by the method and an electronic device including the flexible substrate.

The mechanical strength (tensile strength) of the flexible substrate in the machine direction (MD) is different by 10 MPa or less from that in the transverse direction (TD) and the coefficient of thermal expansion of the flexible substrate in the machine direction (MD) is different by 5 ppm/° C. or less from that in the transverse direction (TD).

According to one embodiment, the electronic device may be fabricated using the flexible substrate based on a roll-to-roll process.

According to one embodiment, the electronic device may be selected from the group consisting of solar cells, organic light emitting diode lighting devices, semiconductor devices, and display devices. The display devices may be flexible organic electroluminescent devices.

Details of other embodiments according to various aspects of the invention are included in the following description.

According to the method of the present invention, a flexible substrate can be continuously produced based on a roll-to-roll process, and at the same time, a flexible substrate layer can be easily separated from a carrier substrate by the application of a relatively small physical stimulus without involving laser or light irradiation or dissolution. Therefore, the method of the present invention enables the production of a flexible substrate for use in an electronic device, such as a flexible display device, in an easier manner and the production process can be simplified. In addition, the production cost and time can be reduced. The device of the present invention can be prevented from deterioration of reliability and occurrence of defects caused by laser or light irradiation.

According to the method of the present invention, since a flexible substrate is obtained by separating a flexible substrate layer supported on a carrier substrate, a force applied to the flexible substrate along the machine direction is not substantially different from that along the transverse direction, and as a result, the flexible substrate has uniform mechanical, thermal, and optical properties without significant differences in the machine and transverse directions.

According to the method of the present invention, a flexible substrate with metal wires can be obtained in the form of a roll. The use of the flexible substrate increases the efficiency of a subsequent process for fabricating an electronic device, enabling more efficient fabrication of an electronic device.

BRIEF DESCRIPTION OF THE DRAWINGS

FIG. 1 illustrates a method for producing a flexible substrate according to one embodiment of the present invention.

FIG. 2 illustrates a method for producing a flexible substrate with metal patterns according to a further embodiment of the present invention.

FIG. 3 shows photographs and SEM images of a flexible substrate with metal patterns produced in Example 2.

DETAILED DESCRIPTION OF THE INVENTION

As the present invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, detailed explanations of related art are omitted when it is deemed that they may unnecessarily obscure the essence of the present invention.

It will be understood that when an element such as a layer, membrane, film or substrate is referred to as being "above" or "on" another element, it can be directly on the other element or one or more intervening elements may also be present. It will also be understood that when an element such as a layer, membrane, film or substrate is referred to as being "under" another element, it can be directly under the other element or one or more intervening elements may also be present.

Unless otherwise mentioned, the term "physical stimulus" used herein is intended to include mechanical stimuli such as peeling, cutting, friction, tension and compression causing no chemical changes, and it refers to a stimulus by which the cross-sections of a laminate structure can be exposed regardless of what means or mode is employed. In some cases, the physical stimulus may have a strength greater than 0 N but not greater than 0.1 N per unit area. That is, the application of the physical stimulus means that the cross-sections of a laminate structure are exposed regardless of what means is used. Preferably, the physical stimulus is applied in such a manner that two or more cross-sections of a laminate structure forming the end portions of a flexible substrate are exposed at predetermined intervals.

As used herein, the term "adhesion strength" refers to the adhesion strength of a carrier substrate to a flexible substrate before application of the physical stimulus, and the term "peel strength" refers to the adhesion strength of a carrier substrate to a flexible substrate after application of the physical stimulus.

The present invention provides a method for producing a flexible substrate, including feeding a carrier substrate including a polyimide resin, forming a flexible substrate layer on the carrier substrate, separating the flexible substrate layer from the carrier substrate layer by the application of a physical stimulus without causing chemical changes in the carrier substrate and the flexible substrate layer, and winding the flexible substrate layer separated from the carrier substrate layer to collect the flexible substrate layer in the form of a roll wherein the steps are performed by a roll-to-roll process.

According to one embodiment, the method may further include forming metal patterns on the carrier substrate before formation of the flexible substrate layer. In this embodiment, a flexible substrate with the metal patterns can be produced.

The flexible substrate layer is composed of a polyimide resin and may be formed by casting a composition including a diamine and an excess of an acid dianhydride on a support, followed by heating and curing. For example, the molar ratio of the acid dianhydride to the diamine may be in the range of 1:0.95 to 1:0.999, preferably 1:0.98 to 1:0.995. Within this range, the transmittance of the final flexible substrate can be effectively improved.

According to one embodiment, at least a portion of the flexible substrate layer with metal patterns may be in direct contact with the carrier substrate including a polyimide resin. That is, the flexible substrate layer with metal patterns can be formed directly on the carrier substrate without an intervening debonding layer between the carrier substrate and the flexible substrate layer. This structure facilitates peeling of the flexible substrate layer from the carrier substrate.

The metal patterns may be embedded in the flexible substrate layer. The embedding of the metal patterns is effective in protecting the metal patterns from damage even when the flexible substrate is deformed in structure and is thus advantageous in improving the stability and performance of a device.

The roll-to-roll process is a process in which while continuously winding a film or a thin material, such as a copper foil, on a rotating roller, a specific material is applied to or a predetermined portion is removed from the film or thin material to produce a new functional material in the form of a roll. The roll-to-roll process is suitable for large-scale production at reduced cost.

The final flexible substrate produced by the method of the present invention can be produced in the form of a roll and can be used in a subsequent process for fabricating an electronic device, particularly based on a roll-to-roll process.

The carrier substrate used in the method of the present invention may be a soft substrate including a polyimide polymer that can be used in a roll-to-roll process. The carrier substrate may be in the form of a roll before or after a roll-to-roll process. The carrier substrate can be stretched flat during the process and may have a highly heat and chemical resistant structure capable of withstanding a tension applied during the roll-to-roll process and heat generated during curing. Particularly, the carrier substrate can be easily separated from the final flexible substrate.

The present invention also provides a flexible substrate produced by the method. When supported on the carrier substrate, the mechanical strength (tensile strength) of the flexible substrate layer in the machine direction (MD) may be different by 10 MPa or less from that in the transverse direction (TD) and the coefficient of thermal expansion of the flexible substrate layer in the machine direction (MD) may be different by 5 ppm/° C. or less from that in the transverse direction (TD).

The present invention also provides an electronic device including the flexible substrate.

According to a preferred embodiment of the present invention, the flexible substrate layer is separated from the carrier substrate simultaneously with the collection of the flexible substrate layer.

The physical stimulus applied to separate the flexible substrate layer from the carrier substrate may be a tension generated during winding by collection means.

A more detailed description will now be given concerning a flexible substrate, a method for producing the flexible substrate, a device substrate produced using the flexible substrate, a method for producing the device substrate, a device including the device substrate, and a method for fabricating the device according to embodiments of the present invention.

Specifically, the flexible substrate layer formed on the carrier substrate can be peeled by a physical stimulus. Therefore, the flexible substrate layer can be separated from the carrier substrate even without the need for the formation of a sacrificial layer between the carrier substrate and flexible substrate layer and the need for laser or light irradiation or dissolution to remove the sacrificial layer. This enables the production of the flexible substrate in an easier manner.

The flexible substrate can be continuously produced using the carrier substrate including a polyimide resin with particular characteristics based on a roll-to-roll process. The use of the carrier substrate eliminates the need for a complicated process, such as laser or light irradiation, to remove a sacrificial layer and facilitates separation of the flexible substrate layer from the carrier layer simply by the application of a physical stimulus. The flexible substrate layer can be wound and collected to obtain the flexible substrate in the form of a roll. The flexible substrate has the advantage of uniform mechanical, optical, and thermal properties in the machine and transverse directions and is convenient to use in a subsequent process for fabricating an electronic device, for example, based on a roll-to-roll process, due to its roll shape.

FIG. 1 illustrates a method for producing a flexible substrate according to one embodiment of the present invention but the present invention is not limited thereto.

As illustrated in FIG. 1, a carrier substrate 1 wound in the form of a roll is continuously fed from carrier substrate feeding means 2 and a curable polymer 5 is coated and cured on the carrier substrate 1 by polymer coating means (not shown) to form a flexible substrate layer 11 on the carrier substrate.

The flexible substrate layer 11 is wound and collected in the form of a roll by collection means 10 to obtain a flexible substrate in the form of a roll.

FIG. 2 illustrates a method for producing a flexible substrate with metal patterns according to one embodiment of the present invention but the present invention is not limited thereto.

Referring to FIG. 2, the method will be discussed below in more detail.

A carrier substrate 1 wound in the form of a roll is continuously fed from the feeding means 2, metal patterns 3 are formed on the carrier substrate 1 by patterning means (not shown), and a curable polymer 5 is coated and cured on the metal patterns 3 by polymer coating means (not shown) to form a flexible substrate layer 13 with the metal patterns on the carrier substrate.

The flexible substrate layer 11 with the metal patterns is wound and collected in the form of a roll by collection means 10 to obtain a flexible substrate with the metal patterns in the form of a roll.

The carrier substrate 1 separated from the flexible substrate layer 11 or 13 is also wound and collected in the form of a roll by carrier substrate collection means 20. Alternatively, the collection means 20 may be connected to the carrier substrate feeding means 2. In this case, the collected carrier substrate can be re-fed and reused for the production of the flexible substrate.

The functions and effects of the easy-to-peel carrier substrate are thought to be attributed to the following characteristics of a polyimide resin included in the carrier substrate.

The imidization degree of the polyimide resin included in the carrier substrate 1 is controlled to an appropriate range. The carrier substrate exhibits an adhesion strength above a predetermined level during production of the flexible substrate layer 11 or 13. However, after the production of the flexible substrate is completed, the adhesion strength of the carrier substrate to the flexible substrate can be reduced by a simple physical stimulus, such as a tension applied by the winding means, without laser or light irradiation or dissolution, and hence, the carrier substrate can be easily separated from the flexible substrate layer.

Specifically, when the adhesion strengths of the carrier substrate to the flexible substrate layer before and after the application of a physical stimulus are defined as A1 and A2, respectively, the ratio A2/A1 is from 0.001 to 0.5, preferably from 0.001 to 0.1. The carrier substrate can be easily separated from the flexible substrate layer by a simple physical stimulus, for example, a tension applied by the winding means, without laser or light irradiation.

More specifically, the carrier substrate exhibits an adhesion strength of at least about 1 N/cm, at least about 2 N/cm, or about 3 to about 5 N/cm to the flexible substrate layer before application of a physical stimulus but can exhibit a peel strength of about 0.3 N/cm or less, for example, about 0.2 N/cm or less, about 0.1 N/cm or less, or about 0.001 to 0.05 N/cm from the flexible substrate layer after application of a physical stimulus.

The peel strength of the carrier substrate can be measured under the conditions shown in Table 1.

TABLE 1

| Conditions for peel strength measurement | Film width (mm) | 10 |
| --- | --- | --- |
| | Film length (mm) | 100 |
| | Rate (mm/min) | 50 |
| | Tester | Texture Analyzer (TA.XT plus, Stable micro systems) |
| | Peel angle (°) | 90 |

Specifically, the peel strength can be determined by the following procedure. First, a flexible substrate layer is formed on a carrier substrate to prepare a laminate structure as a sample. A physical stimulus is applied to cut the sample into a rectangular shape having a width of 10 mm. The force required to detach the flexible substrate layer at an angle of 90° from the carrier substrate while holding one end of the flexible substrate layer is measured using the tester under the conditions shown in Table 1. This force is defined as the peel strength of the carrier substrate.

The adhesion strength can be determined by the following procedure. First, a flexible substrate layer is formed on a carrier substrate to prepare a 100 mm wide laminate structure as a sample. A 10 mm wide tape was attached to one end of the flexible substrate layer. The force required to detach the tape at an angle of 90° from the carrier substrate while holding one end of the tape is measured. This force is defined as the adhesion strength of the carrier substrate. A tester and conditions for measuring the force may be the same as those for the peel strength measurement shown in Table 1.

The desired adhesion strength and peel strength of the carrier substrate can be achieved by the imidization degree of the polyimide resin included in the carrier substrate. The imidization degree can be controlled by various factors, for example, the kind and content of monomers for the polyimide resin and the imidization conditions (such as heat treatment temperature and time).

As an example, the polyimide resin included in the carrier substrate may have an imidization degree of about 60% to about 99%, about 70% to 98% or about 75% to 96%. Within this range, the carrier substrate can meet the requirements in terms of adhesion strength and peel strength, and hence, the flexible substrate layer 11 or 13 can be easily separated from the carrier substrate 1 even when a physical stimulus is applied without the need for laser or light irradiation. The imidization degree of the polyimide resin can be defined as the percentage of the integrated intensity of the CN bands observed at 1350 to 1400 $cm^{-1}$ in the IR spectrum after a composition including a polyimide precursor, for example, a polyamic acid resin, is applied and imidized at a temperature of about 200° C. or above with respect to the integrated intensity (100%) of the CN bands observed in the same wavelength range after the composition is imidized at a temperature of about 500° C. or above.

The imidization degree range of the polyimide resin can be achieved by controlling the temperature condition for curing the polyamic acid resin.

As a result of experiments conducted by the present inventors, it was confirmed that the curing temperature conditions for the preparation of the polyimide resin, the imidization degree of the polyimide resin, and the peel strength of the polyimide resin layer can satisfy the relationships shown in Table 2.

TABLE 2

| | Curing temperature (° C.) | | | | | |
| --- | --- | --- | --- | --- | --- | --- |
| | 150 | 200 | 250 | 300 | 350 | 500 |
| Imidization degree (%) | 10.36 | 49.21 | 79.34 | 92.78 | 95.69 | 100 |
| Peel strength (N/cm) | 2.8 | 2.8 | 0.03 | 0.016 | 0.03 | 0.35 |

As shown in Table 2, when the carrier substrate is formed by applying a composition including a polyamic acid resin as a precursor of the polyimide resin on a support and curing the composition at a temperature of about 200° C. or above or 250° C. to 500° C., the carrier substrate has a peel strength not greater than about 0.3 N and the polyimide resin included in the carrier substrate has an imidization degree of about 60% to about 99%, about 70% to about 98%, or about 75% to about 96%. The use of the carrier substrate markedly simplifies a subsequent process for fabricating a device (e.g., a flexible display device) including the flexible substrate, which has already been described above.

The polyimide resin prepared under the control of the curing temperature may have a glass transition temperature ($T_g$) of at least about 200° C., at least about 300° C., or about 350° C. to about 500° C. and a decomposition temperature ($T_d$) of at least 400° C. or 400° C. to 600° C. Due to good heat resistance of the polyimide resin, the carrier substrate is highly resistant to high temperature during processing for the fabrication of a device and can be prevented from warpage in the course of producing the flexible substrate thereon. In addition, the carrier substrate can prevent the reliability of a device from deteriorating. As a result, the use of the carrier substrate enables the fabrication of a device with improved characteristics and high reliability. Specifically, the carrier substrate may have a coefficient of thermal expansion (CTE) not higher than about 30 ppm/° C., not higher than about 25 ppm/° C., not higher than about 20 ppm/° C., or from about 1 to about 17 ppm/° C. at a temperature of 100 to 200° C. and a 1% thermal decomposition temperature (Td1%) of at least 450° C. or at least 470° C.

The carrier substrate 1 meeting the requirements in terms of structural and physical properties is completely peeled from the flexible substrate layer 11 or 13 and thus has no influence on the transparency and optical properties of a device substrate.

The carrier substrate 1 completely separated from the flexible substrate layer 11 or 13 is wound in the form of a roll by the carrier substrate collection means 20. The carrier substrate in the form of a roll may be re-fed into a feeding unit of the apparatus. Alternatively, the collection means 20 may be directly connected to the carrier substrate feeding means 2. In this case, the collected carrier substrate can be reused for the production of the flexible substrate.

A polyamic acid resin as a precursor of the polyimide resin may be prepared by polymerizing a tetracarboxylic dianhydride compound and a diamine compound as monomers. The polyimide resin may be prepared by imidization of the polyamic acid resin.

Specific examples of tetracarboxylic dianhydride compounds suitable as monomers include pyromellitic dianhydride (PMDA), 3,3',4,4'-biphenyltetracarboxylic dianhydride (BPDA), meso-butane-1,2,3,4-tetracarboxylic dianhydride, 3,3',4,4'-benzophenone tetracarboxylic dianhydride (BTDA), 2,3,3',4'-diphenylether tetracarboxylic dianhydride, (ODPA), 3,3',4,4'-diphenylsulfone tetracarboxylic dianhydride (DSDA), 4,4'-(hexafluoroisopropylidene)diphthalic anhydride, 3,3',4,4'-biphenyltetracarboxylic dianhydride (S-BPDA), 1,2,3,4-cyclobutane tetracarboxylic dianhydride, 1,2-dimethyl-1,2,3,4-cyclobutane tetracarboxylic dianhydride, 1,2,3,4-tetramethyl-1,2,3,4-cyclobutane tetracarboxylic dianhydride, 1,2,3,4-cyclopentane tetracarboxylic dianhydride, 1,2,4,5-cyclohexane tetracarboxylic dianhydride, 3,4-dicarboxy-1,2,3,4-tetrahydro-1-naphthalene succinic dianhydride, 5-(2,5-dioxotetrahydrofuryl)-3-methyl-3-cyclohexene-1,2-dicarboxylic dianhydride, 2,3,5-tricarboxy-2-cyclopentane acetic dianhydride, bicyclo[2.2.2]octo-7-en-2,3,5,6-tetracarboxylic dianhydride, 2,3,4,5-tetrahydrofuran tetracarboxylic dianhydride, 3,5,6-tricarboxy-2-norbornane acetic dianhydride, or derivatives thereof. It should be understood that other various tetracarboxylic dianhydrides may also be used.

Specific examples of diamine compounds suitable as monomers include: aromatic diamines, such as p-phenylenediamine (PDA), m-phenylenediamine (m-PDA), 2,4,6-trimethyl-1,3-phenylenediamine, 2,3,5,6-tetramethyl-1,4-phenylenediamine, 4,4'-diaminodiphenyl ether, 3,4'-diaminodiphenyl ether, 3,3'-diaminodiphenyl ether, 4,4'-diaminodiphenyl sulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, 2,2-bis[4-(3-aminophenoxy)phenyl]propane, 2,2-bis[4-(4-aminophenoxy)phenyl]propane (6HMDA), 2,2'-bis(trifluoromethyl)benzidine (TFMB), 3,3'-bis(trifluoromethyl)-4,4'-diaminobiphenyl (3,3'-TFDB), 4,4'-bis(3-aminophenoxy)diphenylsulfone (DBSDA), bis(3-aminophenyl)sulfone (3DDS), bis(4-aminophenyl)sulfone (4DDS), 1,3-bis(3-aminophenoxy)benzene (APB-133), 1,4-bis(4-aminophenoxy)benzene (APB-134), 2,2'-bis[3(3-aminophenoxy)phenyl]hexafluoropropane (3-BDAF), 2,2'-bis[4-(4-aminophenoxy)phenyl]hexafluoropropane (4-BDAF), 2,2'-bis(3-aminophenyl)hexafluoropropane (3,3'-6F), 2,2'-bis(4-aminophenyl)hexafluoropropane (4,4'-6F), and 4,4'-oxydianiline (ODA); and aliphatic diamines, such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, 4,4'-diamino-3,3'-dimethyldicyclohexylmethane, 4,4'-diamino-3,3'-dimethyldicyclohexylmethane, 1,2-bis-(2-aminoethoxy)ethane, bis(3-aminopropyl)ether, 1,4-bis(3-aminopropyl)piperazine, 3,9-bis(3-aminopropyl)-2,4,8,10-tetraoxaspiro[5.5]-undecane, or 1,3-bis(3-aminopropyl)tetramethyldisiloxane. There is no particular restriction on the kinds of the tetracarboxylic dianhydride and the diamine compound, but it is important for the acid dianhydride to have no linker structure between aromatic rings in order to more appropriately meet the requirements of the carrier substrate in terms of physical properties, for example, low CTE range and peel strength described above. The tetracarboxylic dianhydride is preferably an aromatic tetracarboxylic dianhydride of Formula 1:

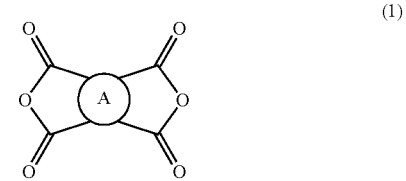

(1)

wherein A is a tetravalent aromatic organic group derived from an acid dianhydride, specifically a tetravalent aromatic organic group of Formula 2a or 2b:

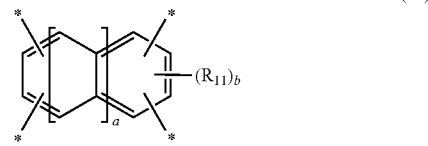

(2a)

wherein $R_{11}$ is a $C_1$-$C_4$ alkyl (for example, methyl, ethyl or propyl) or $C_1$-$C_4$ haloalkyl (for example, fluoromethyl, bromomethyl, chloromethyl or trifluoromethyl) group, a is an integer from 0 to 3, and b is an integer from 0 to 2, preferably 0,

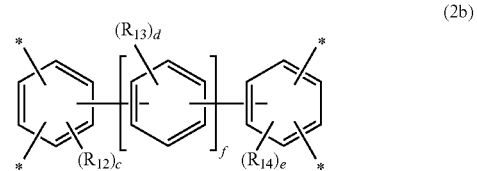

(2b)

wherein $R_{12}$ to $R_{14}$ are each independently a $C_1$-$C_4$ alkyl (for example, methyl, ethyl or propyl) or $C_1$-$C_4$ haloalkyl (for example, fluoromethyl, bromomethyl, chloromethyl or trifluoromethyl) group, c and e are each independently an integer from 0 to 3, preferably 0, d is an integer from 0 to 4, preferably 0, and f is an integer from 0 to 3.

Particularly, the tetracarboxylic dianhydride is more preferably pyromellitic dianhydride (PMDA) of Formula 3a or 3,3',4,4'-biphenyltetracarboxylic dianhydride (BPDA) of Formula 3b:

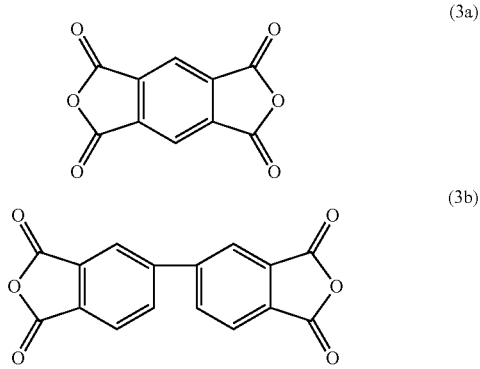

(3a)

(3b)

In the compound of Formula 3b, the structure is linear and the two aromatic rings are directly connected without a linker structure.

As the packing density of the carrier substrate 1 increases, the intermolecular space decreases and it is thus difficult for the molecules to interpenetrate, resulting in low bonding strength. As a consequence, the adhesion strength of the carrier substrate 1 to the overlying flexible substrate layer 11 is reduced and the peel strength of the flexible substrate layer from the laminate structure is also reduced. The packing density can be represented by CTE. The higher the packing density, the lower the CTE value, and vice versa. Accordingly, it is preferred that the diamine compound is an aromatic diamine compound having a linear structure, specifically, an aromatic diamine compound of Formula 4a or 4b:

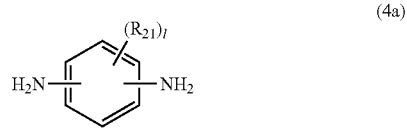

(4a)

wherein $R_{21}$ is a $C_1$-$C_{10}$ alkyl (for example, methyl, ethyl or propyl) or $C_1$-$C_4$ haloalkyl (for example, fluoromethyl, bromomethyl, chloromethyl or trifluoromethyl) group and l is an integer from 0 to 4, preferably 0,

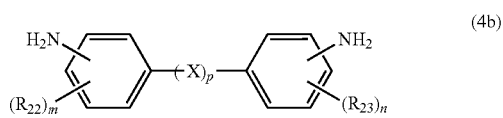

(4b)

wherein $R_{22}$ and $R_{23}$ are each independently a $C_1$-$C_{10}$ alkyl (for example, methyl, ethyl or propyl) or $C_1$-$C_4$ haloalkyl (for example, fluoromethyl, bromomethyl, chloromethyl or trifluoromethyl) group, X is selected from the group consisting of —O—, —$CR_{24}R_{25}$—, —C(=O)—, —C(=O)O—, —C(=O)NH—, —S—, —SO—, —$SO_2$—, —O[$CH_2CH_2$O]$_q$—, $C_6$-$C_{18}$ monocyclic and polycyclic cycloalkylene (for example, cyclohexylene and norbornene) groups, $C_6$-$C_{18}$ monocyclic and polycyclicarylene (for example, phenylene and naphthalene) groups, and combinations thereof, $R_{24}$ and $R_{25}$ are each independently selected from the group consisting of a hydrogen atom, $C_1$-$C_{10}$ alkyl (for example, methyl, ethyl and propyl) groups, and $C_1$-$C_{10}$ haloalkyl (for example, fluoromethyl, bromomethyl, chloromethyl, and trifluoromethyl) groups, q is an integer of 1 or 2, m and n are each independently an integer from 0 to 4, preferably 0, and p is an integer of 0 or 1, preferably 0.

The use of the aromatic diamine compound more appropriately meets the requirements of the carrier substrate in terms of physical properties.

Examples of preferred aromatic diamine compounds include p-phenylenediamine (PDA), benzidine (BZD), m-tolidine, and 2,2'-bis(trifluoromethyl)benzidine (TFMB).

These monomers are polymerized in a polar organic solvent to prepare the desired polyamic acid resin. The polyamic acid resin is subjected to imidization at the curing temperature described above in the presence or absence of an imidization catalyst such as an amine catalyst to prepare the polyimide resin.

It is particularly preferred to use the tetracarboxylic dianhydride in a larger amount than the aromatic diamine because the transmissivity of the flexible substrate layer can be improved. For example, the tetracarboxylic dianhydride and the diamine may be used in a molar ratio of 1:0.95-0.999, preferably 1:0.98-0.995.

Conditions other than the curing temperature for the preparation of the polyamic acid resin or the polyimide resin are well known to those skilled in the art and can be controlled by suitable methods well known to those skilled in the art, and a further explanation thereof is thus omitted.

The thickness and size of the carrier substrate 1 may be suitably selected depending on the kind of a device to which the flexible substrate is to be applied. Preferably, the carrier substrate has a thickness in the range of 0.01 to 50 mm or 0.02 to 20 mm taking into consideration the transparency of the substrate. Within this range, the carrier substrate has high mechanical strength sufficient to support the flexible substrate.

As the carrier substrate layer decreases in thickness, its adhesion strength to the flexible substrate layer increases. However, an excessively small thickness of the carrier substrate leads to an increase in the adhesion strength of the carrier substrate to the flexible substrate layer, resulting in poor detachability of the carrier substrate from the flexible substrate layer. Within the thickness range defined above, high adhesion strength of the carrier substrate to the flexible substrate layer and good detachability of the carrier substrate from the flexible substrate layer are ensured.

The carrier substrate layer may be produced by any suitable method for producing self-supporting films, such as a tenter or casting method.

According to one embodiment, the carrier substrate layer may be produced by casting on a support, drying at 100 to 150° C., and curing at 150 to 400° C. The curing is preferably performed while the temperature is gradually raised.

According to one embodiment of the present invention, metal micropatterns may be formed on the carrier substrate before application of the resin for producing the flexible substrate on the carrier substrate. In this embodiment, the flexible substrate can be formed with the metal patterns. After formation of the metal patterns on the carrier substrate, the polymer is coated and cured. As a result, the metal patterns can be embedded in the flexible substrate layer.

The embedding of the metal patterns in the substrate decreases the sheet resistance of a transparent electrode, is effective in improving the efficiency of a device, and can protect the metal patterns from damage or disconnection even when the flexible substrate is deformed in shape, making the flexible substrate suitable for use in a flexible device.

A material for the metal patterns is not particularly limited and may be, for example, a metal or alloy, such as silver (Ag), copper (Cu), aluminum (Al), gold (Au), platinum (Pt), nickel (Ni), titanium (Ti), molybdenum (Mo) or an alloy thereof, a conductive metal oxide, such as indium tin oxide (ITO), indium zinc oxide (IZO), indium zinc tin oxide (IZTO), aluminum zinc oxide (AZO), indium tin oxide-silver-indium tin oxide (ITO-Ag-ITO), indium zinc oxide-silver-indium zinc oxide (IZO-Ag-IZO), indium zinc tin oxide-silver-indium zinc tin oxide (IZTO-Ag-IZTO) or aluminum zinc oxide-silver-aluminum zinc oxide (AZO-Ag-AZO), or a metal nitride or oxynitride, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), barium strontium titanate (BST) or lead zirconate-titanate (PZT). Any suitable material that is electrically conductive enough to reduce the sheet resistance of an electrode may be used without limitation.

The metal patterns may be formed by coating or depositing the material on the carrier substrate layer or the flexible substrate layer by a suitable technique, such as inkjet printing, gravure printing, gravure offset printing, aerosol printing, electroplating, vacuum deposition, thermal deposition, sputtering or e-beam deposition.

The metal patterns may be arranged at intervals of 0.05 to 50 mm.

If the metal patterns are densely arranged at intervals of less than 0.05 mm, a rise in processing cost may be inevitable. Meanwhile, if the metal patterns are arranged at intervals exceeding 50 mm, the role of the metal patterns as auxiliary electrodes may be negligible, failing to effectively reduce the sheet resistance of electrodes in contact with the metal patterns.

The width of the metal patterns is preferably from 0.5 to 1000 μm. If the metal patterns have a width of less than 0.5 μm, a complicated process is required for micropatterning and the resistance of the metal patterns increases. Meanwhile, if the metal patterns have a width exceeding 1000 μm, the transmittance of the flexible substrate decreases.

The metal patterns may be used as auxiliary electrodes in an electronic device. In solar cells, organic light emitting diode lighting devices, semiconductor devices, and display devices, exposed portions of the metal patterns 3 are brought into direct contact with transparent electrodes disposed on the substrate to reduce the sheet resistance of the transparent electrodes. However, the mode of contact between the metal patterns 3 and the transparent electrodes is not limited. Also in the case where the metal patterns are wholly embedded in the flexible substrate, auxiliary means may be used to connect the metal patterns as auxiliary electrodes to the transparent electrodes.

As illustrated in FIGS. 1 and 2, the flexible substrate layer 11 or 13 is wound by the flexible substrate collection means 10 to obtain the flexible substrate in the form of a roll. The flexible substrate can be used for the fabrication of a device. More specifically, the flexible substrate can be used in a method for fabricating an electronic device based on a continuous process, such as a roll-to-roll process.

Due to its appropriate adhesion strength to the flexible substrate layer, the carrier substrate can properly fix and support the flexible substrate layer. In addition, the use of the carrier substrate eliminates the need for laser or light irradiation for the separation of the flexible substrate layer, markedly simplifying a process for the fabrication of a device including the flexible substrate and contributing to a remarkable reduction in fabrication cost.

A further embodiment of the present invention provides a device substrate including the flexible substrate and a method for producing the device substrate.

The flexible substrate is not substantially changed by a tension because the flexible substrate layer is supported by the carrier substrate during processing. Accordingly, the flexible substrate has the advantage of uniform mechanical, thermal, and optical properties without significant differences in the machine and transverse directions. For example, the mechanical strength (tensile strength) of the flexible substrate in the machine direction (MD) is different by 10 MPa or less, 5 MPa or less or 3 MPa or less from that in the transverse direction (TD) and the coefficient of thermal expansion of the flexible substrate in the machine direction (MD) is different by 5 ppm/° C. or less, 3 ppm/° C. or less or 1 ppm/° C. or less from that in the transverse direction (TD).

Specifically, the device may be a flexible display device, such as a solar cell having a flexible substrate (for example, a flexible solar cell), an organic light emitting diode (OLED) lighting device having a flexible substrate (for example, a flexible OLED lighting device), a semiconductor device having a flexible substrate, an organic electroluminescent device having a flexible substrate, an electrophoresis device having a flexible substrate or an LCD device having a flexible substrate. An organic electroluminescent device is particularly preferred.

The device may be fabricated by a method including the following steps: producing a flexible substrate with metal patterns and forming a device structure on the flexible substrate (i.e. the step of fabricating a device). The device structure may vary depending on the kind of the device to be fabricated on the flexible substrate. The device structure may be a general one, for example, a semiconductor device structure including a gate electrode, a display device structure including a thin film transistor array, a diode device structure having a P/N junction, an OLED structure including an organic light emitting layer, or a solar cell structure. As an example, the device structure may be an organic electroluminescent device structure including: a transparent electrode disposed at the back side of the flexible substrate where the metal patterns are exposed and including, for example, indium tin oxide (ITO); a light emitting part disposed at the back side of the transparent electrode and including an organic compound; and a metal electrode disposed at the back side of the light emitting part and including a metal, for example, aluminum.

According to one embodiment, the method of the present invention may further include forming a hard coating layer on the carrier substrate before or after formation of the flexible substrate layer. In this embodiment, a flexible substrate with the hard coating layer can be produced.

According to one embodiment, the method of the present invention may further include forming a metal pattern layer on a hard coating layer formed on the flexible substrate layer or forming a hard coating layer on the flexible substrate layer with metal patterns. In this embodiment, a flexible substrate with the metal pattern layer and the hard coating layer can be produced.

The hard coating layer may be any of those generally used in the art and its detailed description is thus omitted.

According to one embodiment, the device including the flexible substrate may be fabricated based on a roll-to-roll process. The flexible substrate in the form of a roll is suitable for use in a roll-to-roll process and can be stretched flat during processing. The formation of metal patterns on the flexible substrate leads to an improvement in mechanical properties, such as impact resistance, allowing the flexible substrate to withstand a force applied during a roll-to-roll process.

As described above, the device of the present invention can be fabricated in a simple manner at greatly reduced cost because there is no need for laser or light irradiation. In addition, the device of the present invention can be prevented from deterioration of reliability or occurrence of defects caused by laser or light irradiation. Furthermore, the embedding of the metal patterns in the substrate decreases the sheet resistance of the transparent electrode, leading to an improvement in the efficiency of the device, and can protect the metal patterns from damage or disconnection even when the flexible substrate is deformed in shape, making the flexible substrate suitable for use in a flexible device.

Hereinafter, embodiments of the present invention will be explained in detail such that the invention can be easily carried out by a person having ordinary knowledge in the art. The invention may, however, be embodied in many different forms and should not be construed as being limited to the embodiments set forth herein.

Example 1

1 mol of BPDA was polymerized with 0.99 mol of PDA to prepare a polyamic acid resin. A composition including 20 wt % of the polyamic acid resin and 80 wt % of DMAc as a solvent was cast on a support. Thereafter, the coating was continuously dried at a temperature of 120° C. and cured at stepwise increasing temperatures (150° C.→230° C.→300° C.→400° C.) for 30 min to form a 50 μm thick film (carrier substrate) including a polyimide resin in the form of a roll.

1 mol of BPDA was polymerized with 0.99 mol of TFMB to prepare a polyamic acid resin. 12 wt % of the polyamic acid resin was mixed with 88 wt % of DMAc as a solvent to prepare a composition for the formation of a flexible substrate layer.

While the carrier substrate was unwound and transferred at a speed of 0.5 m/min, the composition was applied (cast) to the carrier substrate in the form of a roll such that the thickness after drying was 15 μm. The resulting coating was continuously dried at a temperature of 100° C. and cured at a temperature of 300° C. for 30 min to form a polymer layer (flexible substrate layer) including a polyimide resin.

A physical stimulus was applied to the laminate structure such that the cross-section of the flexible substrate layer was exposed without causing chemical changes in the carrier substrate. By the physical stimulus, the flexible substrate layer was separated from the carrier substrate and the carrier substrate remained uncut. After the end of each of the carrier substrate and the flexible substrate layer was attached with a pressure sensitive adhesive tape (adhesion strength 43±6 g/mm), the end of the tape was attached to a take-up roll and the tape was wound at a tension of 5 N to separate the carrier substrate and the flexible substrate layer from each other. As a result, the carrier substrate including the BPDA-PDA polyimide resin and the flexible substrate layer including the BPDA-TFMB polyimide resin were obtained in the form of respective rolls, as illustrated in FIG. 1.

The mechanical properties of the flexible substrate layer in the machine (MD) and transverse directions (TD) were evaluated by the following procedures.

Mechanical Strength

The mechanical properties (including modulus, maximum stress, and maximum elongation) of the film were measured using a universal testing machine (Instron). Specifically, after the film was cut to a size of 5 mm×60 mm, the distance between the grips was set to 40 mm and the tensile strength was measured while pulling the sample at a rate of 20 mm/min.

Coefficient of Thermal Expansion

The coefficient of thermal expansion (CTE) and dimensional change of the film were measured using a thermomechanical analyzer (Q400, TA). The film was cut to a size of 5 mm×20 mm and the sample was loaded using an accessory. For actual measurement, the length of the film was set to 16 mm. The force to pull the film was set to 0.02 N. The film was heated at a rate of 5° C./min from 30° C. to 300° C., cooled at a rate of −5° C./min to 80° C., and heated at a rate of 5° C./min to 400° C. The coefficients of linear thermal expansion of the polyimide film in the MD and TD directions were measured in the temperature range of 100-200° C. and averaged.

TABLE 3

| Mechanical properties | MD | TD |
| --- | --- | --- |
| Mechanical strength (tensile strength, MPa) | 250 | 252 |
| Coefficient of thermal expansion (ppm/° C.) | 13.4 | 13.8 |

Example 2

The procedure of Example 1 was repeated except that aluminum was deposited to a thickness of 200 nm on the carrier substrate and was micropatterned before application of the composition for the formation of a flexible substrate layer to the carrier substrate, as illustrated in FIG. 2. Specifically, a resist ink was coated on the entire surface of a silicone blanket and then a cliche engraved with micropatterns was brought into contact with the blanket to form patterns on the silicone blanket. Subsequently, portions of the coating were removed to form micropatterns on the silicone blanket. The resist ink micropatterns formed on the silicone blanket were transferred to the aluminum-deposited carrier substrate and dried in an oven at 115° C. for 3 min to remove the solvent remaining in the resist patterns. The resist patterned aluminum substrate was etched with an etchant by spraying at 45° C. The etchant was cleaned off with deionized water, followed by drying. The remaining resist ink was removed using a stripper to form aluminum wires on the carrier substrate.

1 mol of BPDA was polymerized with 0.99 mol of TFMB to prepare a polyamic acid resin. A composition including 12 wt % of the polyamic acid resin and 88 wt % of DMAc as a solvent was applied (cast) to the carrier substrate with the aluminum wires such that the thickness after drying was 15 μm. The resulting coating was continuously dried at a temperature of 100° C. and cured at a temperature of 300° C. for 30 min to form a polymer layer (flexible substrate layer) including a polyimide resin. Thereafter, the carrier substrate and the metal wire embedded flexible substrate were obtained in the form of respective rolls in the same manner as described in Example 1.

FIG. 3 illustrates the method for producing the flexible substrate layer with the aluminum wires and shows photographs (right) and SEM images (left) of the aluminum wires, the flexible substrate layer, and the carrier substrate layer. As can be seen from FIG. 3, the aluminum wires were completely transferred to the flexible substrate layer and did not remain on the carrier substrate.

As described above, the flexible substrate produced by the method of the present invention has uniform mechanical, thermal, and optical properties with no significant differences in the machine and transverse directions. In addition, the method of the present invention enables the production of the flexible substrate with metal wires in the form of a roll, contributing to an increase in the efficiency of a subsequent process for fabricating a device.

EXPLANATION OF REFERENCE NUMERALS

1 Carrier substrate
2 Carrier substrate feeding means
3 Metal patterns
5 Curable polymer
10 Flexible substrate collection means
11 Flexible substrate layer
13 Flexible substrate layer with metal patterns
20 Carrier substrate collection means

What is claimed is:

1. A method for producing a flexible substrate, comprising feeding a carrier substrate comprising a polyimide resin, forming a flexible substrate layer comprising a polyimide resin on the carrier substrate, separating the flexible substrate layer from the carrier substrate layer by the application of a physical stimulus without causing chemical changes in the carrier substrate and the flexible substrate layer, and winding the flexible substrate layer separated from the carrier substrate layer to collect the flexible substrate layer in the form of a roll wherein the steps are performed by a roll-to-roll process, and wherein the carrier substrate layer has an adhesion strength of at least 1 N/cm to the flexible substrate layer before application of the physical stimulus.

2. The method according to claim 1, wherein the flexible substrate layer is formed by casting a composition comprising a diamine and an excess of an acid dianhydride, followed by heating and curing.

3. The method according to claim 1, further comprising forming metal patterns on the carrier substrate before formation of the flexible substrate layer to produce a flexible substrate with the metal patterns.

4. The method according to claim 3, wherein at least a portion of the flexible substrate layer is in direct contact with the carrier substrate comprising a polyimide resin.

5. The method according to claim 3, wherein the metal patterns are embedded in the flexible substrate layer.

6. The method according to claim 1, further comprising winding the carrier substrate layer separated from the flexible substrate layer to collect the carrier substrate layer in the form of a roll.

7. The method according to claim 1, wherein the physical stimulus is a tension applied during winding and collection of the carrier substrate and the flexible substrate layer.

8. The method according to claim 1, wherein the carrier substrate layer has a peel strength not greater than 0.3 N/cm from the flexible substrate layer after application of the physical stimulus.

9. The method according to claim 1, wherein the adhesion strength of the carrier substrate layer to the flexible substrate layer before application of the physical stimulus and the peel strength of the carrier substrate from the flexible substrate after application of the physical stimulus are defined as A1 and A2, respectively, wherein the ratio A2/A1 is from 0.001 to 0.5 and wherein the physical stimulus does not cause chemical changes in the carrier substrate and the flexible substrate layer.

10. The method according to claim 1, wherein the polyimide resin is prepared by reacting an aromatic tetracarboxylic dianhydride of Formula 1:

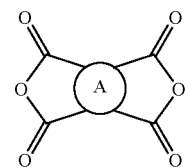

(1)

wherein A is a tetravalent aromatic organic group of Formula 2a or 2b:

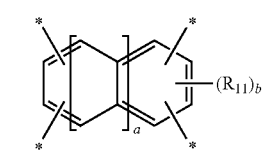

(2a)

wherein $R_{11}$ is a $C_1$-$C_4$ alkyl or $C_1$-$C_4$ haloalkyl group, a is an integer from 0 to 3, and b is an integer from 0 to 2,

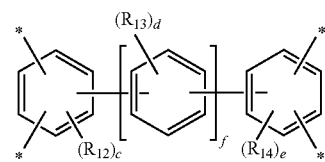

(2b)

wherein $R_{12}$ to $R_{14}$ are each independently a $C_1$-$C_4$ alkyl or $C_1$-$C_4$ haloalkyl group, c and e are each independently an integer from 0 to 3, d is an integer from 0 to 4, and f is an integer from 0 to 3, with an aromatic diamine compound having a linear structure to give a polyamic acid, and curing the polyamic acid at a temperature of 200° C. or above.

11. The method according to claim 10, wherein the diamine compound reacts with an excess of the dianhydride.

12. The method according to claim 11, wherein the aromatic diamine compound is represented by Formula 4a or 4b:

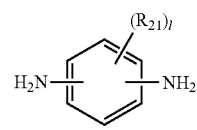

(4a)

wherein $R_{21}$ is a $C_1$-$C_{10}$ alkyl or $C_1$-$C_{10}$ haloalkyl group and l is an integer from 0 to 4,

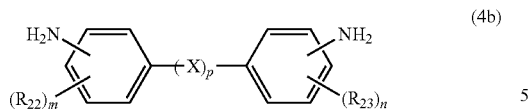

(4b)

wherein $R_{22}$ and $R_{23}$ are each independently a $C_1$-$C_{10}$ alkyl or $C_1$-$C_{10}$ haloalkyl group, X is selected from the group consisting of —O—, —$CR_{24}R_{25}$—, —C(=O)—, —C(=O)O—, —C(=O)NH—, —S—, —SO—, —SO$_2$—, —O[CH$_2$CH$_2$O]$_q$—, $C_6$-$C_{18}$ monocyclic and polycyclic cycloalkylene groups, $C_6$-$C_{18}$ monocyclic and polycyclic arylene groups, and combinations thereof, $R_{24}$ and $R_{25}$ are each independently selected from the group consisting of a hydrogen atom, $C_1$-$C_{10}$ alkyl groups, and $C_1$-$C_{10}$ haloalkyl groups, q is an integer of 1 or 2, m and n are each independently an integer from 0 to 4, and p is an integer of 0 or 1.

* * * * *